United States Patent [19]

Sims, Jr.

[11] 4,431,113

[45] Feb. 14, 1984

[54] COVER ATTACHMENT DEVICE

[75] Inventor: Dewey M. Sims, Jr., Wayne, Mich.

[73] Assignee: Northern Telecom Limited, Montreal, Canada

[21] Appl. No.: 447,631

[22] Filed: Dec. 7, 1982

[51] Int. Cl.³ .................... B65D 41/16; B65D 41/18
[52] U.S. Cl. .................................... 220/306; 220/3.8
[58] Field of Search ................. 220/3.8, 306; 174/66, 174/67

[56] References Cited

U.S. PATENT DOCUMENTS 2,858,179 10/1958 Puerner et al. .................... 220/306
4,215,796 8/1980 Johnston et al. .................... 220/306

Primary Examiner—George T. Hall
Attorney, Agent, or Firm—Schwartz, Jeffery, Schwaab, Mack, Blumenthal & Koch

[57] ABSTRACT

A device for mounting a cover to a support member is disclosed. In the exemplary embodiment the cover has a generally planar top surface and supports two side pieces protruding, in the same direction, from the top surface at approximately right angles thereto. A latching device is supported by each side piece. Each latching device comprises a plurality of prongs and is supported by the side piece such that the area of support is more remote from the top surface than are the free ends of the prongs. The prongs are biased out of the plane of the side piece. At least two recesses, one for each latching device, are provided by the support member and situated so as to mate with the latching devices when the cover is properly installed. Each recess has an internal surface at a predetermined angle to the plane of the side piece (approximately 45°) against which the free ends of the prongs of the latching device can bear so as to provide a latching engagement.

4 Claims, 7 Drawing Figures

0.04 in.

COVER ATTACHMENT DEVICE

BACKGROUND OF THE INVENTION

This invention relates generally to a mounting arrangement, and more particularly to an attachment device for mounting a cover or like object.

It is known when manufacturing electronic equipment or the like to mount covers or shields over some or all of the components. These covers can serve as magnetic barriers, as electro-magnetic barriers, or simply as barriers to prevent unintentional human access to the components. Covers of this sort, if aesthetically pleasing, can even serve as the external cover or lid for a piece of equipment.

One known method of securing such a cover is to use screws or bolts to hold the cover to the main frame of the piece of equipment involved. During the manufacturing process this method involves the use of screws and personnel to install the screws. It also involves the accurate alignment of holes in the cover and in the main frame so that the screws can be installed. An increase in accuracy is usually accompanied by an increase in cost. Relatively speaking, this securing method can be a time consuming chore and adds to the time and cost involved in manufacturing.

SUMMARY OF THE INVENTION

The present invention is directed to a cover, or like object, designed to be retained in place by resilient "fingers" or prongs mating into a recess on the main frame (or support means) itself. The main frame has at least two spaced apart recesses which receive the fingers. The recesses have a contacting surface which the fingers are designed to contact. The fingers themselves are of different lengths so that at least some, but not necessarily all, the fingers engage the contacting surface so that regardless of how far on the cover is pushed, and depending upon the tolerances of the pieces involved, at least one finger in each recess will engage a contacting surface.

Stated in other terms, the present invention is an attachment means for removably attaching a cover means to a support means, the attachment means characterized by: the cover means having a generally planar top surface and supporting at least two side pieces protruding, in the same direction, from the top surface at approximately right angles thereto; latching means supported by the side pieces, at least one latching means per side piece; each latching means comprising a plurality of prongs supported by the side piece at a location more remote from the top surface than the free ends of the prongs, and the free ends of the prongs biased out of the plane of the side piece; and at least two recess means, one for each latching means, are provided by the support means and situated so as to mate with the latching means when the cover is properly installed, and each recess means having an internal surface at a predetermined angle, against which at least a portion of the respective latching means can bear so as to provide a latching engagement between each latching means and its respective recess.

BRIEF DECRIPTION OF THE DRAWINGS

The invention will now be described in more detail with reference to the accompanyng drawings, not to scale, wherein like parts in each of the several figures are identified by the same reference character and wherein.

DETAILED DESCRIPTION

Figure 1:
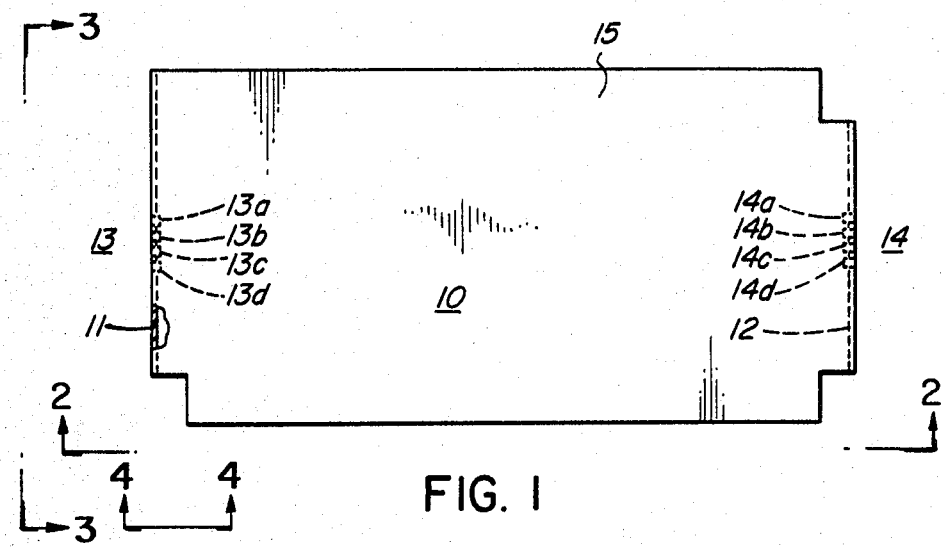
FIG. 1 is a plan view of a cover constructed according to the present invention, partly in section.

FIG. 1 depicts cover 10 in a plan view, partly in section. Cover 10 is formed of sheet steel approximately 0.032 inches thick. In the exemplary embodiment depicted it is approximately 6.7 inches long and approximately 3.4 inches wide. The exact dimensions will of course vary with the application. Cover 10 has two sides indicated generally at 11 and 12 and a top surface 15. Side 11 has four "fingers" or prongs indicated as 13a, 13b, 13c, and 13d and referred to collectively as prongs 13. Side 12 has four "fingers" or prongs indicated as 14a, 14b, 14c, and 14d and referred to collectively as prongs 14.

Figure 2:
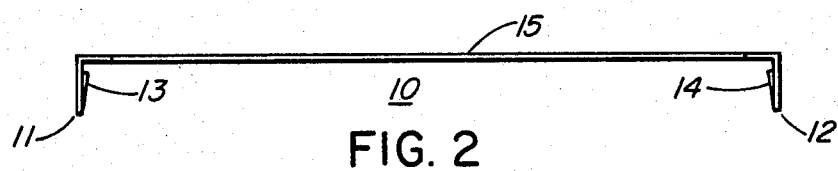
FIG. 2 is a cross-sectional view of the cover of FIG. 1, taken along the section line 2—2 of FIG. 1.

FIG. 2 is a cross-sectional view of cover 10, taken along the section line 2—2 of FIG. 1. Sides 11 and 12 are visible, as are prongs 13 and 14. Note that prongs 13 protrude from side 11 approximately 0.04 inches as depicted, and prongs 14 protrude from side 12 approximately 0.04 inches, as depicted.

Figure 3:
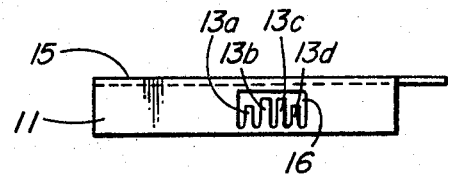
FIG. 3 is a cross-sectional view of the cover of FIG. 1, taken along the section line 3—3 of FIG. 1.

FIG. 3 is a cross-sectional view of cover 10, taken along the section line 3—3 of FIG. 1. Side 11 is depicted as well as the four prongs 13a, 13b, 13c, and 13d and top surface 15. Note that the prongs 13 are formed by removing the material in side 11 that surrounds prongs 13, referenced generally as opening 16. Prongs 13 are then supported solely by the lower part of side 11 (as viewed in FIG. 3) and are bent slightly so as to protrude from the plane of side 11 (bent into the Figure as viewed in FIG. 3). Prongs 14 are formed in a like manner. Note that prongs 13 and prongs 14 each span a distance, left to right in FIG. 3, of approximately ⅜ of an inch.

Figure 4:
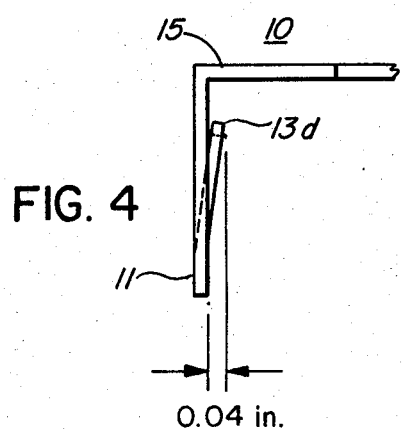
FIG. 4 is an enlargement of one end of the FIG. 2 view, taken along section line 4—4 of that Figure, to show more detail.

FIG. 4 is an enlarged view of side 11 and top surface 15 of cover 10 taken along the section line 4—4 of FIG. 1. Prong 13d is visible and prongs 13a, 13b, and 13c are hidden behind it in this view. Prong 13d is depicted bent out from the plane of side 11, approximately 0.04 inches as depicted.

Figure 5:
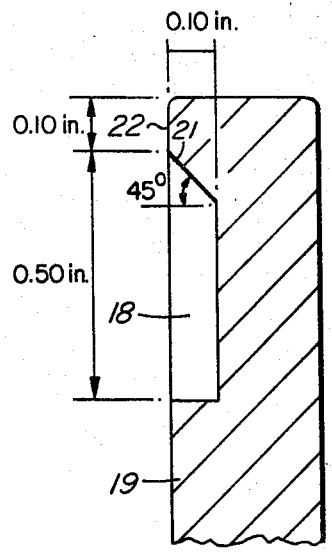
FIG. 5 is a simplified cross-sectional view of a portion of the main frame depicting the recess contained therein.

FIG. 5 is a simplified cross-sectional view of side wall 19, a portion of main frame 17, depicting recess 18. Recess 18 has the approximate dimensions shown in FIG. 5. Recess 18 protrudes in a direction into the paper far enough to completely accommodate prongs 13 (i.e. about 1 inch).

Recess 18 has a top surface 21. Top surface 21 is at an angle of 45° to the horizontal as depicted in the Figure.

Figure 6:
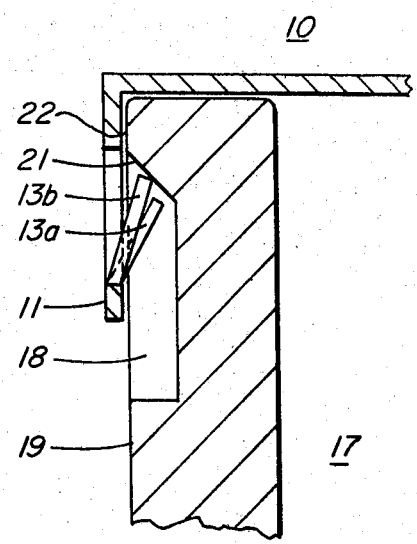
FIG. 6 is the same as FIG. 5 but additionally depicts the cover in place, in one possible state.

FIG. 6 is the same as FIG. 5 but additionally depicts, in section, cover 10 attached to main frame 17. As can be seen in FIG. 6, cover 10 is positioned over the top of side wall 19 such that side 11 of cover 10 is in close proximity to side wall 19. Prong 13b is depicted engaging top surface 21 of recess 18; prong 13a is depicted not contacting any part of recess 18. Prongs 14 (FIG. 1) mate with a similar recess (not shown) in another side wall (not shown) to the right. As a result, once cover 10 is in place it is latched into position and cannot readily be removed. To remove cover 10, one must insert a suitable tool into recess 18, at the bottom thereof not covered by side 11, and bend prongs 13 away from top surface 21 of recess 18.

Prongs 13 are of two different lengths (attention is also directed to FIG. 3). The purpose of this is to ensure that at least two of the prongs 13 make good contact with top surface 21 (FIG. 6) of recess 18. Side wall 19 is molded and consequently the angle that top surface 21 makes with the vertical may not always be as designed. Additionally, cover 10 may be pushed down onto side wall 19 a greater or a lesser amount. In order to ensure good contact between prongs 13 and top surface 21, and consequently good latching properties, prongs 13 are made of two different lengths. Prongs 13a and 13d are approximately 0.29 inches long and prongs 13b and 13c are approximately 0.31 inches long.

Figure 7:
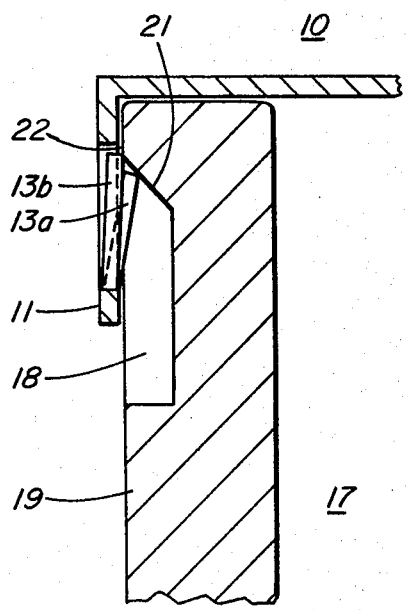
FIG. 7 is similar to FIG. 6 but depicts the cover in a second possible state.

FIG. 7 is similar to FIG. 6 but depicts top surfce 21 in a lower position (lower than it was in FIG. 6). The result is that prong 13b is too long to fit into recess 18 and is pushed back towards side 11 of cover 10 by surface 22 of side wall 19. Prong 13a, being shorter than prong 13b, protrudes into recess 18 and engages surface 21 to latch cover 10 in place.

What is claimed is:

1. An attachment means for removably attaching a cover means to a support means, said attachment means characterized by:
   said cover means having a generally planar top surface and supporting at least two side pieces protruding, in the same direction, from said top surface at approximately right angles thereto;
   latching means supported by said side pieces, at least one said latching means per side piece;
   each said latching means comprising a plurality of prongs supported by said side piece at a location more remote from said top surface than the free ends of said prongs, and said free ends of said prongs biased out of the plane of said side piece; and
   at least two recess means, one for each said latching means, are provided by said support means and situated so as to mate with said latching means when said cover is properly installed, and each said recess means having an internal surface at a predetermined angle, against which at least a portion of said respective latching means can bear so as to provide a latching engagement between each said latching means and its respective recess.

2. The attachment means of claim 1 wherein said predetermined angle is approximately 45 degrees relative to the plane in which said side piece is generally oriented.

3. The attachment means of claim 2 wherein said prongs, on each said latching means, are of at least two differing lengths.

4. The attachment means of claim 3 wherein said prongs of each said latching means are four in number.

* * * * *